United States Patent [19]

Kiyohara

[11] Patent Number: 5,051,809
[45] Date of Patent: Sep. 24, 1991

[54] MEMORY CELL ARRAY OF PLANAR CELL STRUCTURE

[75] Inventor: Masao Kiyohara, Takarazuka, Japan

[73] Assignee: Ricoh Company, Ltd., Tokyo, Japan

[21] Appl. No.: 536,705

[22] Filed: Jun. 12, 1990

[30] Foreign Application Priority Data

Jun. 17, 1989 [JP] Japan .................................. 1-155481

[51] Int. Cl.$^5$ ..................... H01L 27/10; H01L 23/48; H01L 29/04; G11C 11/34
[52] U.S. Cl. ...................................... 357/45; 357/68; 357/71; 357/59; 365/182
[58] Field of Search ....................... 357/45, 68, 71, 91, 357/23.11, 23.12, 59; 365/182

Primary Examiner—Mark Prenty
Attorney, Agent, or Firm—Cooper & Dunham

[57] ABSTRACT

A memory cell array has a continuous diffusion region for source regions of a plurality of memory transistors; a continuous diffusion region for drain regions of the plurality of memory transistors; the both diffusion regions being formed in a substrate in parallel to each other; and word lines electrically insulated from the both diffusion regions and formed in a direction crossing the both diffusion regions; the word lines being composed of polycrystal silicon films in first and second layers and alternately arranged and electrically insulated from each other. A region of the memory transistors for ion implantation is wider than a channel region of the memory transistors. The region of the memory transistors for ion implantation is formed up to the channel region of the memory cell transistors provided by the word lines in the second layer. A thick oxide film is formed on the both diffusion regions.

4 Claims, 3 Drawing Sheets

MEMORY CELL ARRAY OF PLANAR CELL STRUCTURE

BACKGROUND OF THE INVENTION

1. Field of the Invention

The present invention relates to an integrated circuit MOS-type semiconductor device. More particularly, the present invention relates to a memory cell array of a MOS-type memory device.

2. Description of the Related Art

In a general integrated circuit MOS-type semiconductor device, elements are separated from each other by a field oxide film. A source region and a drain region are formed by masking a gate electrode and implanting an impurity into a substrate by a self-aligning method. It is necessary to dispose one or two contact portions between the source and drain regions with respect to one transistor so that high integration is prevented by a contact margin and a wiring pitch.

To solve this problem, a semiconductor integrated circuit device having a so-called planar cell structure is proposed in Laid-Open Japanese Patent applications (KOKAI) Nos. 61-288464, 63-96953, etc.

High density and high integration are desirable for semiconductor memory devices as well as other integrated circuit devices. To provide a fine structure for a memory cell array having the planar cell structure, it is necessary to reduce the pitch of diffusion regions and word lines. However, one limitation is the performance of an apparatus for manufacturing the memory cell array, which tends to limit pitch to 2 μm in the present manufacturing apparatus for mass production.

SUMMARY OF THE INVENTION

It is therefore an object of the present invention to provide a planar cell structure memory cell array having improved integration.

The above object of the present invention can be achieved by a memory cell array comprising a continuous diffusion region for source regions of a plurality of memory transistors; a continuous diffusion region for drain regions of the plurality of memory transistors; both diffusion regions being formed in a substrate in parallel to each other; and word lines electrically insulated from both diffusion regions and formed in a direction crossing the both diffusion regions; the word lines being composed of polycrystalline silicon films in first and second layers which are alternately arranged and are electrically insulated from each other.

Further objects and advantages of the present invention will be apparent from the following description of the preferred embodiments of the present invention as illustrated in the accompanying drawings.

BRIEF DESCRIPTION OF THE DRAWINGS

FIGS. 1a and 1b are respectively a plan view of a general memory cell array and a cross-sectional view taken along line Ib—Ib in FIG. 1a;

FIGS. 2a to 2d show a memory cell array of a planar cell structure in one embodiment of the present invention in which:

FIG. 2a is a plan view of the memory cell array;

FIG. 2b is a cross-sectional view taken along line IIb—IIb of FIG. 2a;

FIG. 2c is a cross-sectional view taken along line IIc—IIc of FIG. 2a;

FIG. 2d is a cross-sectional view taken along line IId—IId of FIG. 2a;

DESCRIPTION OF THE PREFERRED EMBODIMENTS

The preferred embodiments of a memory cell array of a planar cell structure in the present invention will next be described in detail with reference to the accompanying drawings.

Figure 1A:
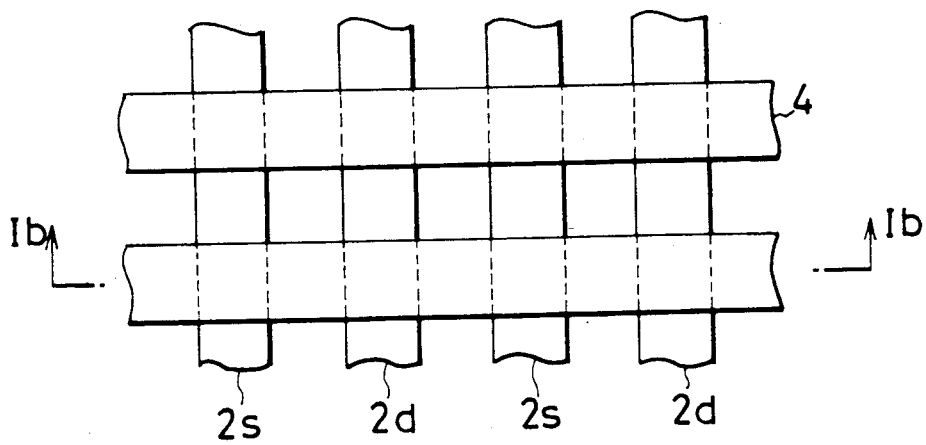
Figure 1B:
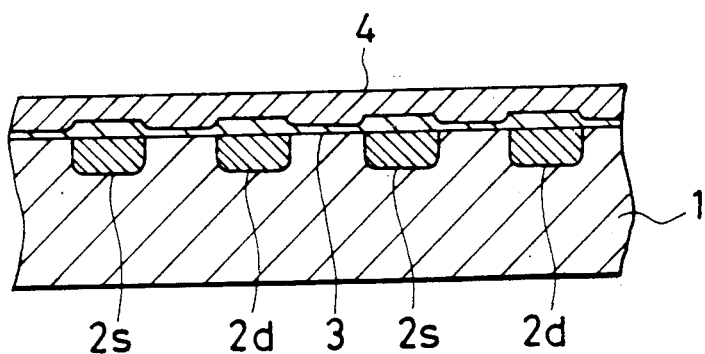

As shown in FIGS. 1a and 1b, the planar cell structure has a continuous diffusion region 2s for a source region of a plurality of memory transistors and a continuous diffusion region 2d for a drain region of the plurality of memory transistors. The continuous diffusion region 2s and the continuous diffusion region 2d are formed in a substrate 1 in parallel to each other. A word line (a gate electrode) 4 is formed on the substrate 1 and crosses both diffusion regions 2s and 2d but is spaced from them by an insulating film 3. In the planar cell structure, it is not necessary to dispose a field oxide film for separating elements from each other. Further, the source region 2s and the drain region 2d are commonly used in the plurality of memory transistors. Accordingly, it is sufficient to dispose one contact portion between the source and drain regions with respect to several memory transistors or tens of memory transistors, which is advantageous in high integration.

The size of a memory cell in the planar cell structure is determined by the pitch of the word line 4 and the pitch of the diffusion regions 2s and 2d for the source and drain regions.

High density and integration are desirable semiconductor memory devices as well as for the integrated circuit devices. To provide a fine structure for the memory cell array having the planar cell structure, it is necessary to reduce the pitch of the diffusion regions 2s and 2d and the word line 4. However, one limitation is the performance of an apparatus for manufacturing the memory cell array, limited to 2 μm in the present manufacturing apparatus for mass production.

In the present invention, word lines are formed by a polycrystalline silicon film having a two-layer structure. The word lines of the polycrystal silicon film in a second layer are arranged between the word lines of the polycrystalline silicon film in a first layer.

When the word lines of the polycrystalline silicon film in the first layer are formed at the same pitch as that of a memory cell array of the general planar cell structure and the word lines of the polycrystalline silicon film in the second layer are arranged between the word lines of the polycrystalline silicon film in the first layer, the density of the memory cell array constructed by the word lines in the first and second layers is doubled in comparison with that of the general memory cell array.

FIGS. 2a to 2d show a memory cell array of a planar cell structure in one embodiment of the present invention.

Figure 2A:
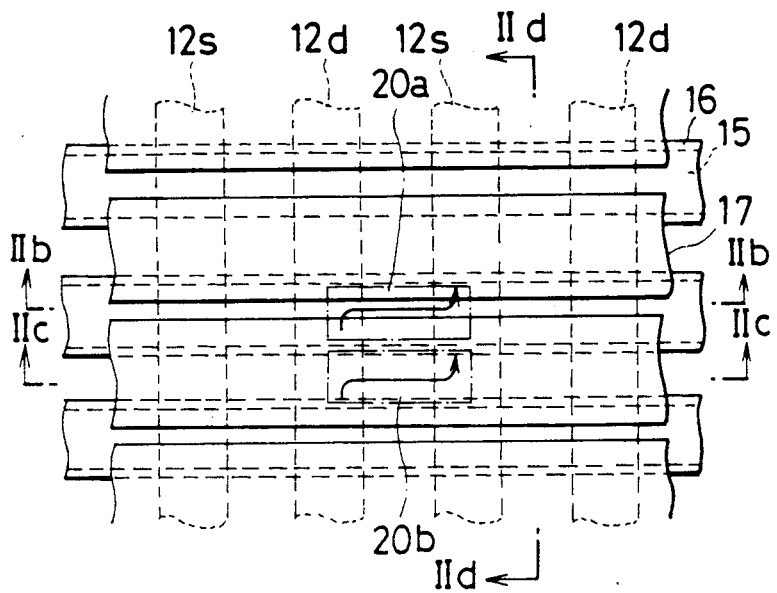

FIG. 2a is a plan view of the memory cell array.

Figure 2D:
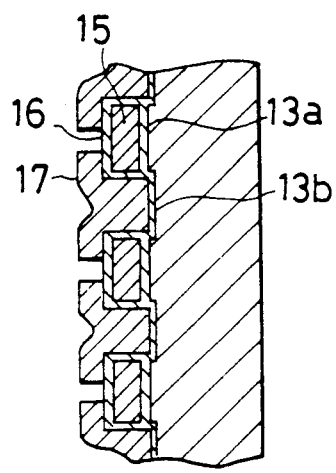
Figure 2B:
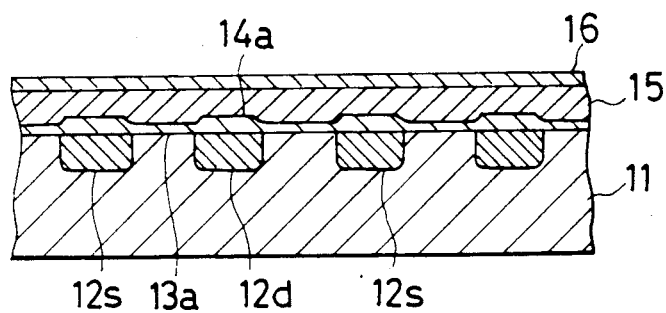

FIG. 2b is a cross-sectional view taken along line IIb—IIb of FIG. 2a.

Figure 2C:
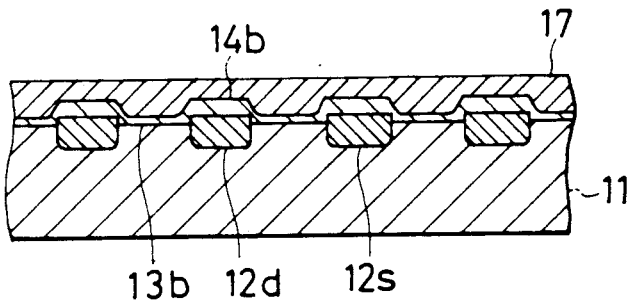

FIG. 2c is a cross-sectional view taken along line IIc—IIc of FIG. 2a.

FIG. 2d is a cross-sectional view taken along line IId—IId of FIG. 2a.

As shown in these figures, in a P-type silicon substrate 11, source and drain regions are respectively formed as N+ diffusion regions 12s and 12d continuously arranged in parallel to each other in the shape of a band with respect to a plurality of memory transistors.

As shown in FIG. 2b, a word line (a gate electrode) 15 is formed on the substrate 11 and is constructed by a polycrystalline silicon film in a first layer. This word line 15 is formed through a gate oxide film 13a and a thick oxide film 14a having a thickness about 1000 to 3000 Å in a direction perpendicular to a longitudinal direction of the diffusion regions 12s and 12d. A surface of the word line 15 is coated with an oxide film 16.

A word line (a gate electrode) 17 is constructed by the polycrystal silicon film in a second layer and is formed in a region between the adjacent word lines 15 in the first layer. As shown in FIG. 2c, a gate oxide film 13b is formed between the substrate 11 and the word line 17 in the second layer. A surface of a substrate portion forming the gate oxide film 13b is etched so that this surface of the substrate portion is lower than a surface of a substrate portion forming the gate oxide film 13a. The word line 17 in the second layer is formed through the gate oxide film 13b and a thick oxide film 14b having a thickness about 1000 to 3000 Å on the diffusion regions 12s and 12d. This word line 17 is formed in parallel to the word line 15, i.e., in the direction perpendicular to the longitudinal direction of the diffusion regions 12s and 12d.

An oxide film 16 covers a surface of the word line 15 and is formed as an insulating film between the word lines 15 and 17 so as to provide electrical insulation between the word lines 15 and 17.

The diffusion regions 12s and 12d sequentially construct the source region 12s, the drain region 12d, the source region 12s,—.

An insulating film is further formed on the oxide film 16 and the word line 17 although this insulating film is not shown in FIGS. 2a to 2d. Metallic wiring is then formed on this insulating film and is electrically connected to the diffusion regions and the word lines through contact holes formed in the insulating film.

In FIG. 2a, each of regions 20a and 20b surrounded by chain lines shows one memory transistor. Each of the memory transistors has a threshold value in voltage set by ion implantation to decide a ROM code. This threshold value is set to be high by implanting e.g., boron into channel regions of these memory transistors, or is set to be low without implantation of any ions. When the word line 15 of the memory transistor 20a is selected and a voltage is applied to this memory transistor and the threshold value of the memory transistor 20a is low, an electric current flows from the drain region (a bit line) 12d to the source region 12s. When the threshold value of the memory transistor 20a is high, no electric current flows from the drain region 12d to the source region 12s. Accordingly, the contents of the ROM are read by a sense circuit connected to the bit line 12d. The above operation is similarly performed with respect to the other memory transistors.

A method for manufacturing the memory cell array in the above embodiment of the present invention will next be described with reference to FIGS. 2 to 5.

Figure 3:
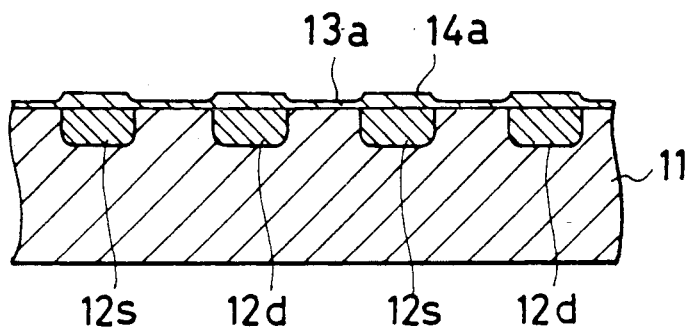
FIG. 3 is a cross-sectional view showing an intermediate manufacturing process in a method for manufacturing the memory cell array in the one embodiment of the present invention.

(A) As shown in FIG. 3, in accordance with a general manufacturing process, a diffusion region 12s constituting the source region and a diffusion region 12d constituting the drain region (the bit line) are formed in the P-type silicon substrate 11.

Thereafter, a gate oxide film 13a and an oxide film 14a are formed by a thermal oxidation method. When a thermal oxidation condition at this time is set such that the thickness of the gate oxide film 13a is about 250 Å, the thickness of the oxide film 14a becomes about 1400 Å on the diffusion regions 12s and 12d by accelerated oxidation.

(B) An ion implantation is then carried out to perform a channel doping operation for controlling a threshold voltage.

Figure 4:
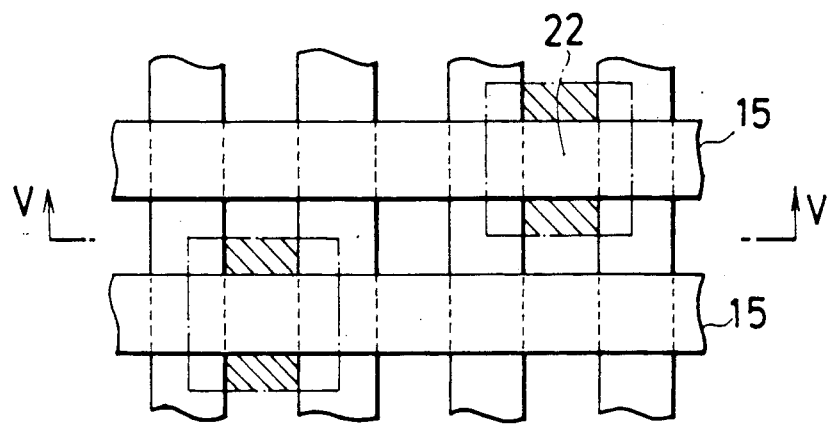
FIG. 4 is a plan view showing an intermediate manufacturing process of the method for manufacturing the memory cell array in the one embodiment of the present invention.

As shown in FIG. 4, a polycrystalline silicon film in the first layer is then formed and a word line 15 in the first layer is formed by photolithography and etching.

(C) A resist pattern is then formed by a photolithography technique to determine the memory contents of a memory transistor for performing a reading operation by the word line 15 in the first layer. Then, a required portion of the memory transistor is selected and boron is implanted into this transistor portion by an ion implantation method to increase the threshold voltage of the corresponding memory transistor. A region 22 surrounded by a chain line in FIG. 4 is a region for ion implantation. This region 22 is wider than a channel region of the memory transistor, i.e., a region located below the word line 15 and is formed up to a channel region of the memory transistor provided by a word line formed later in the second layer.

(D) Next, an oxide film in a region surrounded by the word line 15 and the diffusion regions 12s and 12d is removed by etching. When the thickness of the oxide film in this region is about 250 Å, a thick oxide film having a thickness about 1400 Å is formed on the diffusion regions 12s and 12d so that it is possible to selectively remove the oxide film in this surrounded region.

(E) A silicon substrate is etched by about 0.5 μm in the region in which the oxide film is removed in the process (D), thereby removing the impurity implanted into regions (which are shown by hatching in FIG. 4) outside the channel region of the memory transistor into which ion implantation was carried out in the process (C).

Figure 5:
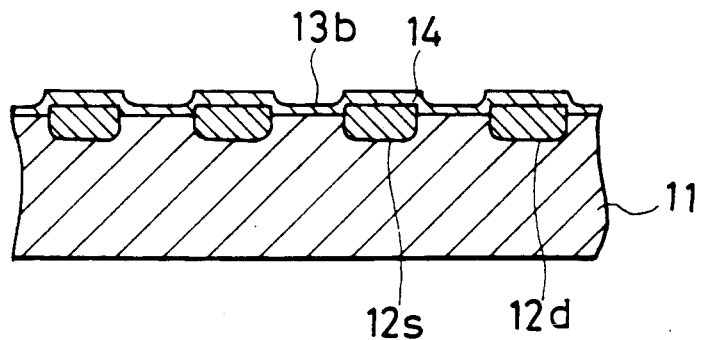
FIG. 5 is a cross-sectional view showing an intermediate manufacturing process of the method for manufacturing the memory cell array in the one embodiment of the present invention.

(F) Thereafter, gate oxidation is performed. FIG. 5 is a cross-sectional view of the memory cell array after the oxide film is formed on line V-V in FIG. 4. A gate oxide film 13b having a thickness about 250 Å is formed in the region in which the silicon substrate is etched. Thus, a thick oxide film 14b including the oxide film left in the etching thereof in the process (D) is formed on the diffusion regions 12s and 12d. An insulating film 16 shown in FIG. 2d is simultaneously formed on a surface of the word line 15 in the first layer.

(G) A resist pattern is formed by photolithography to decide the memory contents of the memory transistor by a word line in the second layer formed in a subsequent process. Boron is then implanted by the ion implantation method by masking this resist pattern and the word line 15 in the first layer so as to increase a threshold value of the corresponding memory transistor. At this time, the ions are implanted at an energy lower than that in the ion implantation in the process (C) such that no ions are transmitted through the polycrystalline silicon film of the word line 15 in the first layer.

(H) A polycrystalline silicon film is formed in the second layer and is patterned by photolithography and etching to form a word line 17 in the second layer. FIGS. 2a to 2d show this state.

Thereafter, in accordance with general manufacturing processes, an insulating film, contact holes, metallic wiring and a passivation film are formed.

In the present invention, the word lines of the memory cell array having the planar cell structure are constructed by a two-layer polycrystalline silicon film such that the word lines in the second layer are arranged between the word lines in the first layer. Accordingly, when the word lines in the first and second layers are respectively formed at the same pitch as that of the general word lines, integration degree can be doubled in comparison with that in the general memory cell array.

Many widely different embodiments of the present invention may be constructed without departing from the spirit and scope of the present invention. It should be understood that the present invention is not limited to the specific embodiments described in the specification, except as defined in the appended claims.

What is claimed is:

1. A memory cell array comprising:
   a continuous diffusion region for source regions of a plurality of memory transistors;
   a continuous diffusion region for drain regions of the pluarlity of memory transistors;
   both of said continuous diffusion regions being formed in a substrate in parallel to each other; and
   word lines electrically insulated from both of said continuous diffusion regions and formed in a direction crossing both of said continuous diffusion regions;
   said word lines being composed of a plurality of polycrystalline silicon films which are alternately arranged in first and second levels which are electrically insulated from each other.

2. A memory cell array as claimed in claim 1, in which said memory transistors have respective channel regions and wherein ions are implanted in implantation regions of said memory transistors which are wider than the respective channel regions of the memory transistors.

3. A memory cell array as claimed in claim 2, in which said word lines composed of the second level polycrystalline silicon films said word lines of the second level define a plurality of memory transistors and wherein said implantation regions of the memory transistors defined by the second level word lines are formed up to the channel region of the memory cell transistors provided by the word lines in the second level.

4. A memory cell array as claimed in claim 1, wherein a thick oxide film is formed on both of said diffusion regions.

* * * * *